(12) United States Patent
Nurminen et al.

(10) Patent No.: US 7,202,505 B2
(45) Date of Patent: Apr. 10, 2007

(54) HIGH POWER LIGHT-EMITTING DIODE PACKAGE AND METHODS FOR MAKING SAME

(75) Inventors: Janne Nurminen, Oulunsalo (FI); Marko Nivala, Oulu (FI); Jarkko Kivelä, Haukipudas (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/118,970

(22) Filed: Apr. 29, 2005

(65) Prior Publication Data
US 2006/0243998 A1 Nov. 2, 2006

(51) Int. Cl.
*H01L 27/15* (2006.01)

(52) U.S. Cl. .................. 257/81; 257/13; 257/E51.018; 438/25; 438/E23.001

(58) Field of Classification Search ................ 257/675, 257/706, 707, 713, 717, 720, 730, 13, 79–82, 257/918; 361/705, 719, 720; 438/25, 956
See application file for complete search history.

(56) References Cited

U.S. PATENT DOCUMENTS

| | | | | |
|---|---|---|---|---|
| 5,506,755 A | * | 4/1996 | Miyagi et al. .............. 361/720 |
| 5,923,084 A | * | 7/1999 | Inoue et al. ................. 257/712 |
| 6,058,013 A | * | 5/2000 | Christopher et al. ........ 361/704 |
| 6,205,028 B1 | * | 3/2001 | Matsumura ................. 361/720 |
| 2006/0131732 A1 | * | 6/2006 | Nah et al. .................... 257/706 |

* cited by examiner

*Primary Examiner*—Quoc Hoang
(74) *Attorney, Agent, or Firm*—Harrington & Smith, PC

(57) ABSTRACT

In a light-emitting diode package made in accordance with the present invention, a light-emitting diode assembly is positioned above a spacer assembly. In the light-emitting diode assembly, a die containing a light-emitting diode is positioned above a substrate. During operation, both the combination of at least one conductive plate adjacent to the die and a plurality of castellated side holes positioned on sides of the substrate, and a substrate thermal via positioned beneath the die, conduct thermal energy from the die to a light-emitting diode assembly pad on which the substrate is mounted. The light-emitting diode assembly pad conducts thermal energy to a top pad of the spacer assembly. A plurality of castellated side holes formed in sides of a spacer of the spacer assembly and a plurality of thermal vias positioned within the spacer conduct thermal energy from the top pad of the spacer assembly to a base pad of the spacer assembly.

17 Claims, 8 Drawing Sheets

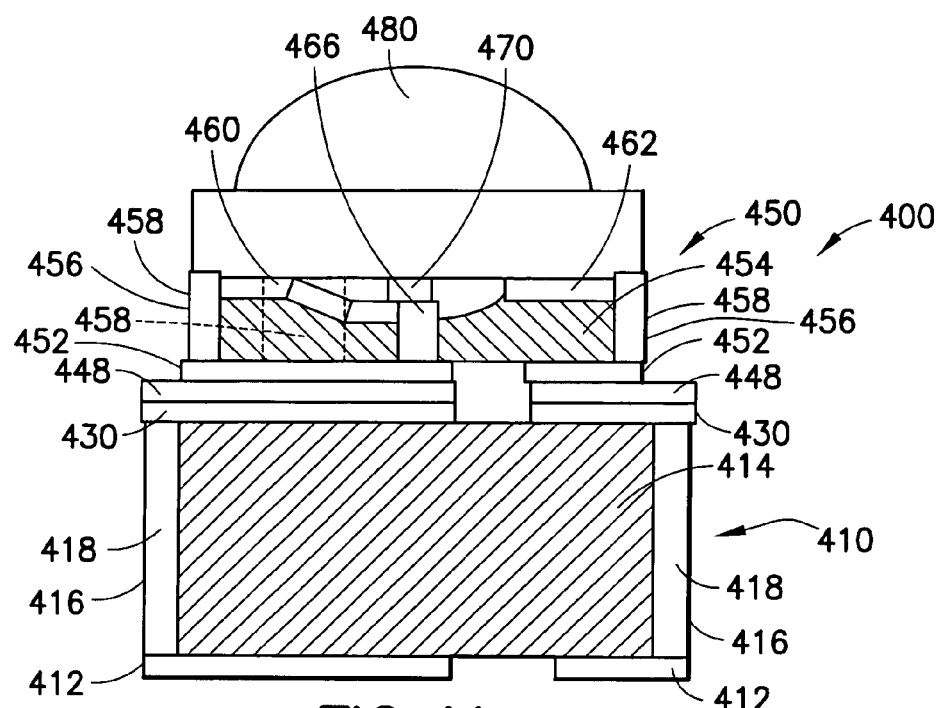
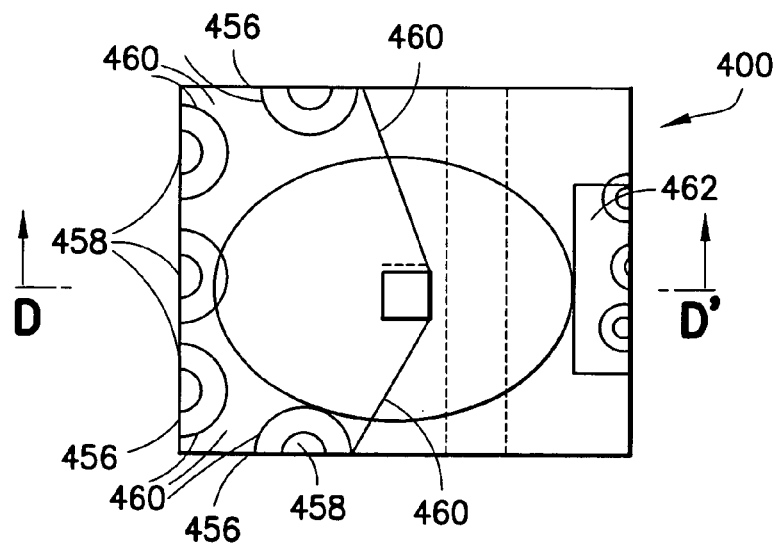

HIGH POWER LIGHT-EMITTING DIODE PACKAGE AND METHODS FOR MAKING SAME

TECHNICAL FIELD

These teachings generally concern light-emitting diodes packages, and more particularly concern light-emitting diode package designs that have improved thermal dissipation properties and thus allow light-emitting diodes to operate at higher power loadings.

BACKGROUND

Light-emitting diodes ("LEDs") are semiconductor devices that emit light when a voltage or current are applied to their terminals. LEDs have found widespread application in consumer electronics. It is well-known to those skilled in the art to use LEDs in alphanumeric displays; control panels; remote controls and many other applications.

As with many electronic circuit devices, there are often particular applications which require relatively high-power operating conditions for LEDs. In such situations, LEDs create significant thermal energy during operation. In addition, current LED architectures are incapable of handling increased power loads without the possibility of failure.

Thus, those skilled in the art desire improved LED package designs that are capable of handling significantly-increased power loads without failure. In particular, LED packages with improved capability to dissipate thermal energy during operation are desired.

SUMMARY OF THE PREFERRED EMBODIMENTS

The foregoing and other problems are overcome, and other advantages are realized, in accordance with the presently preferred embodiments of these teachings.

A first alternate embodiment of the present invention comprises a light-emitting diode package comprising: a spacer assembly comprising: a base pad made from conductive material; a spacer made from insulating material positioned atop the base pad, where a first plurality of castellated side holes are formed in sides of the spacer, the first plurality of castellated side holes formed at least in part from conductive material, the conductive material of the first plurality of castellated side holes in contact with the conductive material of the base pad, the spacer further comprising a plurality of internal cavities in contact with, and extending away from, the base pad; a top pad made from conductive material positioned above the spacer, the top pad in contact with the first plurality of castellated side holes of the spacer and the plurality of internal cavities of the spacer; a thermal via formed in each of the plurality of internal cavities in the spacer, the thermal vias made from conductive material and serving to conduct thermal energy from the top pad to the base pad; a light-emitting diode assembly positioned above the spacer assembly and affixed to the top pad of the spacer assembly, the light-emitting diode assembly comprising: a light-emitting diode assembly base pad made from conductive material; a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the light-emitting diode assembly base pad; a die containing a light-emitting diode positioned atop the substrate; at least one plate made from conducting material positioned atop the substrate extending from the die to sides of the substrate, the at least one plate serving to conduct thermal energy away from the die containing the light-emitting diode to the second plurality of castellated side holes in the substrate; and a substrate thermal via positioned within a cavity of the substrate, the substrate thermal via extending from the die to the light-emitting diode assembly base pad, the substrate thermal via made from conducting material and serving to conduct thermal energy from the die to the light-emitting diode assembly base pad; and whereby during operation thermal energy is first conducted away from the light-emitting diode to the light-emitting diode assembly base pad by the substrate thermal via and the combination of the at least one plate and the second plurality of castellated side holes, and then conducted from the light-emitting diode assembly base pad to the base pad of the spacer assembly by the top pad, the first plurality of castellated side holes and the plurality of thermal vias positioned within the spacer.

A second alternate embodiment of the present invention comprises a light-emitting diode package comprising: a base pad made from conductive material; a substrate made from insulating material positioned atop the base pad, where a plurality of castellated side holes are formed in sides of the substrate, the plurality of castellated side holes formed at least in part from conductive material, the conductive material of the plurality of castellated side holes in contact with the conductive material of the base pad; a die containing a light-emitting diode positioned atop the substrate; at least one plate made from conducting material positioned atop the substrate and extending from the die to sides of the substrate, the at least one plate serving to conduct thermal energy away from the die containing the light-emitting diode to the castellated side holes of the substrate; and a substrate thermal via positioned within a cavity of the substrate, the substrate thermal via extending from the die to the base pad, the substrate thermal via made from conductive material and serving to conduct thermal energy from the die containing the light-emitting diode to the base pad; and whereby during operation thermal energy is conducted away from the die containing the light-emitting diode to the base pad by the substrate thermal via and the combination of the at least one plate and the plurality of castellated side holes.

A third alternate embodiment of the present invention comprises a light-emitting diode package comprising: a spacer assembly comprising: a base pad made from conductive material; a spacer made from insulating material positioned atop the base pad, where a first plurality of castellated side holes are formed in sides of the spacer, the first plurality of castellated side holes formed at least in part from conductive material, the conductive material of the first plurality of castellated side holes in contact with the conductive material of the base pad, the spacer further comprising a plurality of internal cavities in contact with, and extending away from, the base pad; a top pad made from conductive material positioned above the spacer, the top pad in contact with the first plurality of castellated side holes of the spacer and the plurality of internal cavities of the spacer; a thermal via formed in each of the plurality of internal cavities in the spacer, the thermal vias made from conductive material and serving to conduct thermal energy from the top pad to the base pad; a light-emitting diode assembly positioned above the spacer assembly and affixed to the top pad of the spacer assembly, the light-emitting diode assembly comprising: a light-emitting diode assembly base pad made from conductive material; a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the light-emitting diode assembly base pad; a die containing a light-emitting diode positioned atop the substrate; at least one plate made from conducting material positioned atop the substrate extending from the die to sides of the substrate, the at least one plate serving to conduct thermal energy away from the die containing the light-emitting diode to the second plurality of castellated side holes in the substrate; and whereby during operation thermal energy is first conducted away from the light-emitting diode to the light-emitting diode assembly base pad by the at least one plate and the second plurality of castellated side holes, and then conducted from the light-emitting diode assembly base pad to the base pad of the spacer assembly by the top pad, the first plurality of castellated side holes and the plurality of thermal vias positioned within the spacer.

A fourth alternate embodiment of the present invention comprises a light-emitting diode package comprising: a spacer assembly comprising: a base pad made from conductive material; a spacer made from insulating material positioned atop the base pad, where a first plurality of castellated side holes are formed in sides of the spacer, the first plurality of castellated side holes formed at least in part from conductive material, the conductive material of the first plurality of castellated side holes in contact with the conductive material of the base pad; a top pad made from conductive material positioned above the spacer, the top pad in contact with the first plurality of castellated side holes of the spacer; a light-emitting diode assembly positioned above the spacer assembly and affixed to the top pad of the spacer assembly, the light-emitting diode assembly comprising: a light-emitting diode assembly base pad made from conductive material; a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the light-emitting diode assembly base pad; a die containing a light-emitting diode positioned atop the substrate; at least one plate made from conducting material positioned atop the substrate extending from the die to sides of the substrate, the at least one plate serving to conduct thermal energy away from the die containing the light-emitting diode to the second plurality of castellated side holes in the substrate; and a substrate thermal via positioned within a cavity of the substrate, the substrate thermal via extending from the die to the light-emitting diode assembly base pad, the substrate thermal via made from conducting material and serving to conduct thermal energy from the die to the light-emitting diode assembly base pad; and whereby during operation thermal energy is first conducted away from the light-emitting diode to the light-emitting diode assembly base pad by the substrate thermal via and the combination of the at least one plate and the second plurality of castellated side holes, and then conducted from the light-emitting diode assembly base pad to the base pad of the spacer assembly by the top pad and the first plurality of castellated side holes.

A fifth alternate embodiment of the present invention comprises a method for making a light-emitting diode package comprising: forming a spacer assembly, wherein forming a spacer assembly comprises: forming a spacer assembly base pad from conductive material; forming a spacer made from insulating material atop the spacer assembly base pad; forming a first plurality of castellated side holes on sides of the spacer, the first plurality of castellated side holes formed at least in part from conductive material, the conductive material in contact with the conductive material of the spacer assembly base pad; forming a plurality of internal cavities in the spacer, the internal cavities contacting the spacer assembly base pad, and extending upwards away from the spacer assembly base pad; forming a plurality of thermal vias in the plurality of internal cavities of the spacer from conductive material; forming a spacer assembly top pad atop the spacer, the spacer assembly top pad made from conductive material, the conductive material of the spacer assembly top pad in contact with the conductive material of the thermal vias and the first plurality of castellated side holes; forming a light-emitting diode assembly, wherein forming a light-emitting diode assembly comprises: forming a light-emitting diode assembly base pad from conductive material; forming a substrate from insulating material above the light-emitting diode assembly base pad; forming a cavity in the substrate, the cavity contacting the light-emitting diode assembly base pad and extending upward away from the light-emitting diode assembly base pad; forming a substrate thermal via in the cavity of the substrate; forming a second plurality of castellated side holes on sides of the substrate, the second plurality of castellated side holes formed at least in part from conductive material, the conductive material of the second plurality of castellated side holes in contact with the conductive material of the light-emitting diode assembly base pad; forming at least one plate atop the substrate from conductive material, the plate extending from a position where a die containing a light-emitting diode is to be positioned on the substrate to the sides of the substrate, the conductive material of the at least one plate contacting the conductive material of the second plurality of castellated side holes; and placing the die containing the light-emitting diode on the substrate above the substrate thermal via and adjacent to the at least one plate; and affixing the light-emitting diode assembly base pad to the top pad of the spacer assembly.

Thus it is seen that the foregoing alternate embodiments of the present invention overcome the limitations of the prior art. In particular, the high-power infrared light-emitting diode package of the present invention provides improved thermal dissipation capabilities over packages made in accordance with the prior art. Infrared light-emitting diodes incorporated in packages made in accordance with the present invention can operate at significantly higher power levels without experiencing an undue decrease in the mean time between failure, as in the case of infrared light-emitting diodes incorporated in packages made in accordance with the prior art.

BRIEF DESCRIPTION OF THE DRAWINGS

The above and other aspects and advantages of this invention will be apparent upon consideration of the following detailed description, taken in conjunction with the accompanying drawings in which like characters refer to like elements throughout and in which:

FIG. 4A is a cross-sectional view of an LED package made in accordance with a further embodiment of the present invention taken along section D–D' of FIG. 4B;

FIG. 4B is a top ghost view of an LED package made in accordance with a further embodiment of the present invention;

DETAILED DESCRIPTION OF THE PREFERRED EMBODIMENTS

Figure 1A:
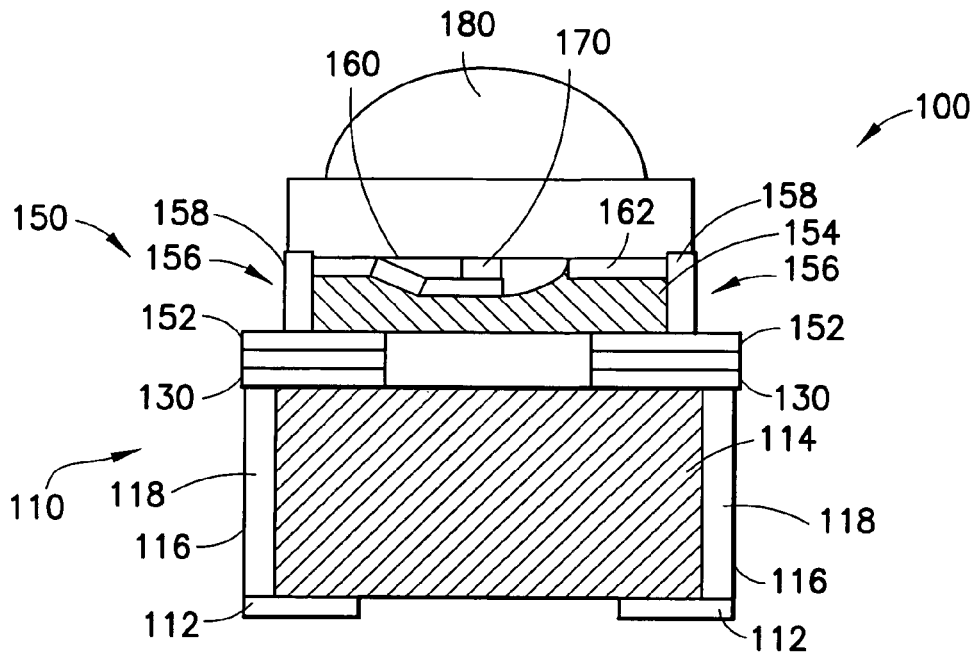
FIG. 1A is a cross-sectional view of an LED package made in accordance with the prior art taken along section A–A' of FIG. 1B.
Figure 1B:
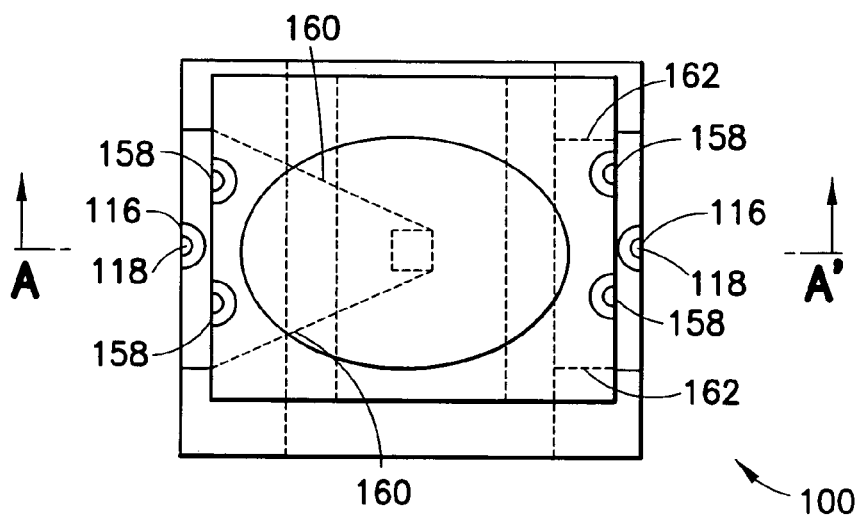
FIG. 1B is a top ghost view of an LED package made in accordance with the prior art.

An infrared ("IR") LED package 100 made in accordance with the prior art is depicted in FIGS. 1A–B and comprises a spacer assembly 110 affixed to a light-emitting diode assembly 150. The spacer assembly 110 comprises a spacer 114 made from insulating material positioned between a base pad 112 and a top pad 130 both made from conductive material (for example, copper). Formed in sides 116 of the spacer 114 are a first plurality of castellated side holes 118 made in part from conducting material. The conducting material of the first plurality of castellated side holes 118 is in contact with the conductive material of the base pad 112 and the top pad 130.

Positioned atop the spacer assembly 110 is the light-emitting diode assembly 150 comprising a light-emitting diode assembly base pad 152 made from conductive material. Positioned above the light-emitting diode assembly base pad 152 is a substrate 154 made from insulating material for supporting a die 170. Formed in sides 156 of the substrate 154 is a second plurality of castellated side holes 158 made in part from conductive material. The conductive material of the second plurality of castellated side holes 158 is in contact with the light-emitting diode assembly base pad 152. Conductive plates 160, 162 are positioned adjacent to, and are in contact with, die 170 containing the light-emitting diode. In the embodiment depicted in FIG. 1A–B, conductive plate 160 extends beneath die 170. The conductive plates 160, 162 serve to conduct thermal energy away from the die 170 to the second plurality of castellated side holes 158.

Positioned above the light-emitting diode assembly 150 is a lens 180.

As is apparent from an examination of FIGS. 1A–B, the die 170 containing the light-emitting diode is surrounded for the most part by insulating material in the form of the substrate 154 and spacer 114. This situation significantly limits the ability of the package 100 to dissipate thermal energy generated by the light-emitting diode during operation, and thereby limits the ability of the light-emitting diode to operate at higher power loadings. Accordingly, those skilled in the art desired an improved high power IR light-emitting diode package design with substantially improved thermal energy dissipation capability.

Figure 2A:
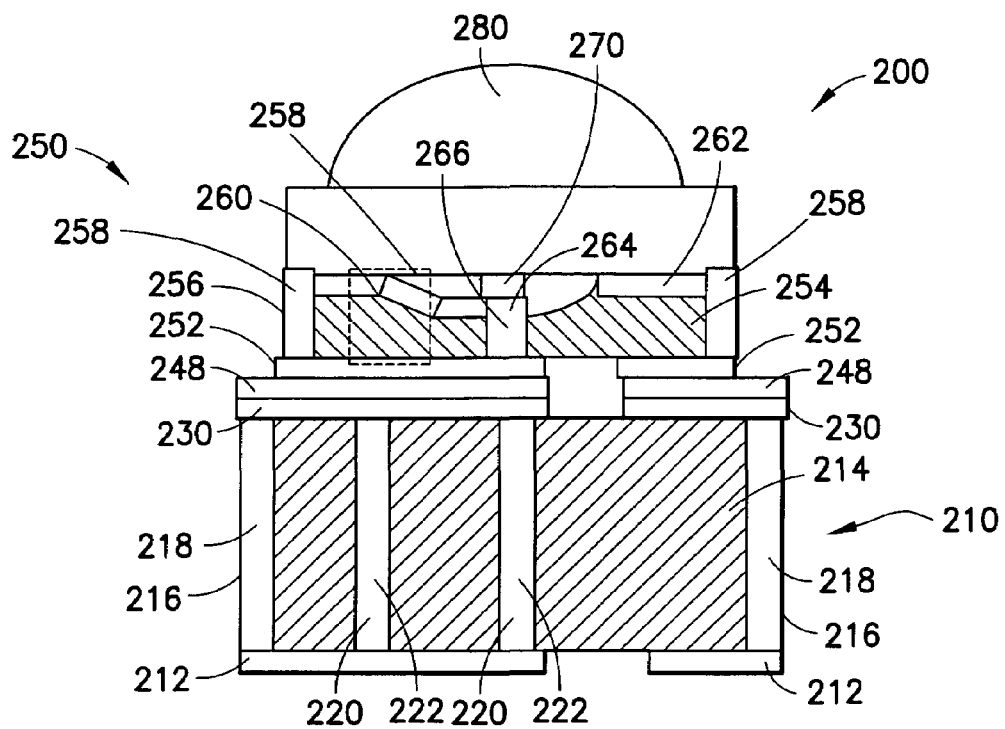
FIG. 2A is a cross-sectional view of an LED package made in accordance with an embodiment of the present invention taken along section B–B' of FIG. 2B.
Figure 2B:
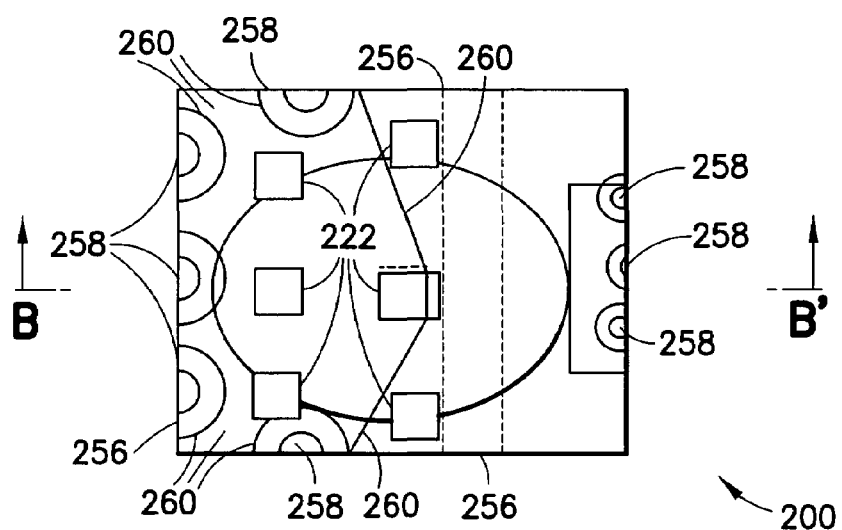
FIG. 2B is a top ghost view of an LED package made in accordance with an embodiment of the present invention.

An improved high power IR light-emitting diode package 200 made in accordance with the present invention and overcoming the limitations of the prior art is depicted in FIGS. 2A–B. In the improved light-emitting diode package 200 of the present invention, a spacer assembly 210 is affixed by, for example, solder 248, to a light-emitting diode assembly 250. The spacer assembly 210 comprises a spacer 214 made from insulating material positioned between a base pad 212 and a top pad 230 both made from conductive material. Formed in sides 216 of the spacer 214 are a first plurality of castellated side holes 218 made in part from conducting material. The conducting material of the first plurality of castellated side holes 218 is in contact with the conductive material of the base pad 212 and top pad 230, and during operation serves to conduct thermal energy from the top pad 230 to the base pad 212.

An improvement of the present invention is apparent in the spacer assembly 210. Formed in the spacer 214 is a plurality of internal cavities 220 in contact with, and extending away from, the base pad 212. Formed within the internal cavities 220 is a plurality of thermal vias 222. The thermal vias 222 can be fabricated in many ways; for example, they can be created by plating the internal cavities 220 with thermally conductive material (for example, copper or copper compounds), or the cavities can be filled in their entirety with conductive material. The plurality of thermal vias 222 are in contact with, and serve to conduct thermal energy away from, the top pad 230 positioned atop the spacer 214.

Positioned atop the spacer assembly 210 is a light-emitting diode assembly 250 comprising a substrate 254 positioned above a light-emitting diode assembly base pad 252. The light-emitting diode assembly base pad 252 is made from conductive material, and the substrate 254 from insulating material. Positioned above the substrate 254 is a die 270 containing the light-emitting diode.

Another improvement of the present invention is apparent from examination of FIGS. 2A–B. In contrast to the prior art light-emitting diode package 100, a second plurality of castellated side holes 258 are arrayed on all sides 256 of the substrate. Further in contrast to the light-emitting diode package 100 of the prior art, in the light-emitting diode package of the present invention, at least one conductive plate 260 fans outward from the die 270 and contacts ones of the second plurality of castellated side holes 258 positioned on at least two sides 256 of the substrate 254 (in the embodiment of FIGS. 2A–B, conductive plate 260 contacts castellated side holes on three sides of the substrate). The increased dimensions and improved arrangement of the conductive plate 260 and the castellated side holes of the second plurality 258 provide improved thermal dissipation properties for the light-emitting diode 200 of the present invention in comparison to those of the prior art. Plate 262 also conducts thermal energy to castellated side holes located on another side of the substrate 254.

In alternate embodiments of the present invention, the substrate 254 may have three or more vertical sides 256, or may be circular or oval in configuration. In such embodiments, individual ones of the second plurality of castellated side holes 258 would be positioned on each of the sides of the substrate or, in embodiments having a cylindrical substrate, about the circumference of the substrate. In such embodiments, at least one conductive plate would fan outward from the 270 to contact castellated side holes from the second plurality on at least two sides, or about the periphery, of the substrate 254.

An additional improvement of the light-emitting diode package 200 of the present invention over that of the prior art is apparent in the substrate 254 of the light-emitting diode assembly 250. Positioned beneath the die 270 in a cavity 264 of the substrate is a base thermal via 266. The base thermal via 266 positioned beneath the die 270 serves to conduct thermal energy away from the die 270 to the light-emitting diode assembly pad 252.

Further improvements apparent in the light-emitting diode package 200 cooperate with the preceding improvements to further increase the thermal dissipation properties of the package 200 over those of the prior art. For example, the base pad 212 is enlarged over that of the prior art light-emitting diode package 100 extending to a position where it is beneath die 270 and cooperating with the plurality of thermal vias 222 in the spacer. The light-emitting diode assembly pad 252 of the light-emitting diode package 200 is similarly enlarged and also cooperates with the base thermal via 262 to improve the thermal dissipation properties of the package 200. Notably, there is a direct thermal path from die 270 through the thermal vias 266 and 222 to the spacer base pad 212.

A lens 280 is postioned above die 270.

Thus, taken together, the improvements incorporated in the light-emitting diode package 200 made in accordance with the present invention serve to provide additional thermal conduits to conduct thermal energy away from the light-emitting diode during operation. One of ordinary skill in the art will also understand that the thermal conduits can serve a dual purpose by also establishing electrical contacts for the light emitting diode with power sources external to the light-emitting diode package. Alternatively, separate electrical contacts may be used.

The improved thermal dissipation properties of light-emitting diode packages incorporating the improvements of the present invention provide high-power infrared ("IR") light-emitting diode packages with the ability to operate at higher power loadings. The improvements of the present invention are also applicable to light-emitting diodes operating at different frequencies where improved thermal dissipation properties are likewise desired.

In alternate embodiments of the present invention, the improvements depicted in FIGS. 2A–B can be used alone or in combination. In addition, a spacer element need not be used.

Figure 3A:
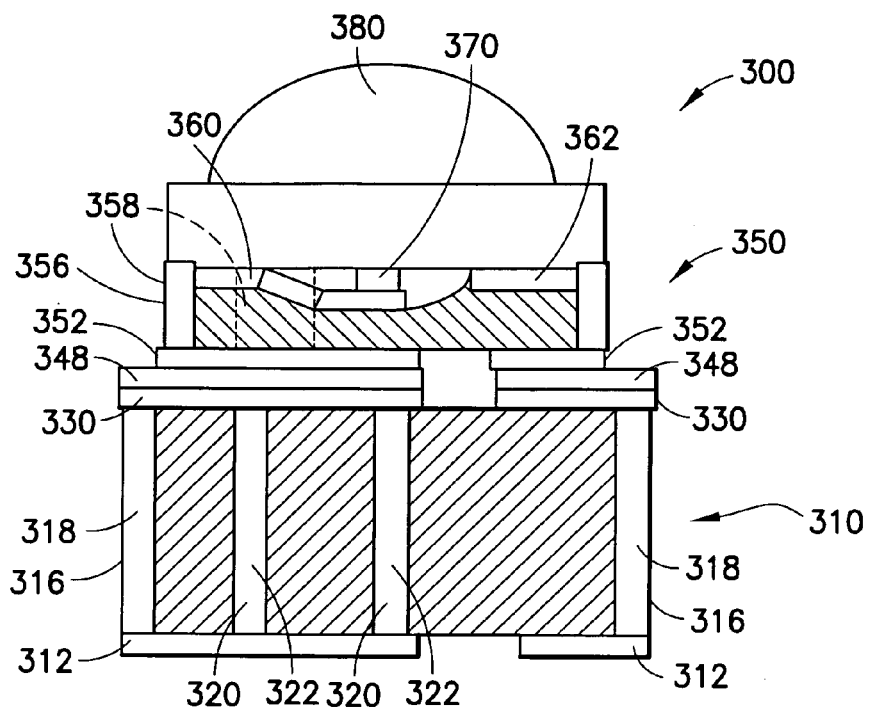
FIG. 3A is a cross-sectional view of an LED package made in accordance with another embodiment of the present invention taken along section C–C' of FIG. 3B.
Figure 3B:
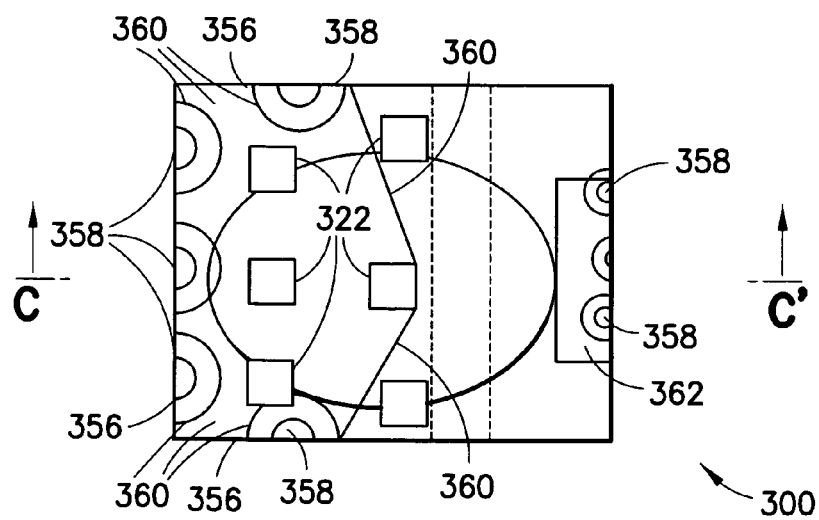
FIG. 3B is a top ghost view of an LED package made in accordance with another embodiment of the present invention.

FIGS. 3A–B depict another embodiment having a spacer. The light-emitting diode package 300 comprises a light-emitting diode assembly 350 positioned atop, and affixed by a solder layer 348 to, a spacer assembly 310 using a solder joint 348. The spacer assembly 310 comprises a spacer 314 made from insulating material positioned between a base pad 312 and a top pad 330 both made from conductive material. Formed in sides 316 of the spacer 314 are a first plurality of castellated side holes 318 made in part from conducting material. The conducting material of the first plurality of castellated side holes 318 is in contact with the conductive material of the base pad 312 and top pad 330, and during operation serves to conduct thermal energy from the top pad 330 to the base pad 312.

Incorporated in the spacer assembly is one of the improvements of the present invention previously depicted in, and described with respect to, FIGS. 2A–B. Formed in the spacer 314 is a plurality of internal cavities 320 in contact with, and extending away from, the base pad 312. Formed within the internal cavities 320 is a plurality of thermal vias 322. As described with respect to FIGS. 2A–B, the thermal vias 322 can be fabricated in many ways; for example, they can be created by plating the internal cavities 320 with thermally conductive material (for example, copper or copper compounds), or the cavities can be filled in their entirety with conductive material. The plurality of thermal vias 322 are in contact with, and serve to conduct thermal energy away from, the top pad 330 located above the spacer 314.

A light-emitting diode assembly 350 is affixed by solder joint 348 to, and positioned above, the spacer assembly 310. The light-emitting diode assembly 350 comprises at least in part a substrate 354 positioned above a light-emitting diode assembly base pad 352. The light-emitting diode assembly base pad is made from conductive material, and the substrate 354 from insulating material. A die 370 containing a light-emitting diode is located above the substrate 354.

The light-emitting diode package 300 depicted in FIGS. 3A–B incorporates another improvement depicted in, and described with respect to, FIGS. 2A–B. In this improvement, a second plurality of castellated side holes 358 is arrayed on all sides 356 of the substrate. Two conductive plates 360, 362 extend outward from the die 370 and contact ones of the second plurality of castellated sideholes 358 positioned on the sides 356 of the substrate. In particular, conductive plate 360 fans outward from the die 370 and contacts ones of the second plurality of castellated side holes 358 on three sides 356 of the substrate 354. The increased dimensions and improved arrangement of the conductive plate 360 and the castellated side holes 358 of the second plurality provide improved thermal dissipation properties for the light-emitting diode package 300 of the present invention in comparison to those of the prior art.

A lens 380 is positioned above die 370.

In combination, the improvements of the light-emitting diode package 300 of the present invention serve to improve the thermal dissipation properties of the package 300. During operation, thermal energy is conducted away from the die 370 first by the combination of the plates 360, 362 and the second plurality of castellated side holes 358. This combination conducts thermal energy to the light-emitting diode assembly base pad 352. From the light-emitting diode assembly base pad 352, thermal energy is then conducted to the spacer assembly base pad 312 by the combination of the top pad 330, the first plurality of castellated side holes 318 and the plurality of thermal vias 322.

A further embodiment of the present invention having a different combination of improvements over prior-art light-emitting diode packages is depicted in FIGS. 4A–B. In the improved light-emitting diode package 400 of the further embodiment of the present invention, a spacer assembly 410 is affixed to a light-emitting diode assembly 450 by a solder joint 448. In the spacer assembly 410, a spacer 414 made from insulating material is positioned between a base pad 412 and a top pad 430 both made from conductive material. Formed in sides 416 of the spacer 414 are a first plurality of castellated side holes 418 made in part from conductive material. The conductive material of the first plurality of castellated side holes 418 is in contact with the conductive material of the base pad 412 and top pad 430, and during operation serves to conduct thermal energy away from the top pad 430 to the base pad 412.

The light-emitting diode assembly 450 is affixed by any known method familiar to those skilled in the art, for example, soldering, to the spacer assembly 410. The light-emitting diode assembly comprises a substrate 454 positioned above a light-emitting diode assembly base pad. The light-emitting assembly base pad 452 is made from conductive material, and the substrate 454 from insulating material. Positioned above the substrate 454 is a die 470 containing the light-emitting diode. A lens 480 is positioned above the die 470.

An improvement incorporated in a preceding embodiment is likewise included in the further embodiment of the present invention and comprises a second plurality of castellated side holes arrayed on all sides of the substrate. At least one conductive plate 460 fans outward from the die 470 and contacts ones of the second plurality of castellated side holes 458 positioned on three sides of the substrate. The increased dimensions of the conductive plate 460 and the castellated side holes of the second plurality 458 provide improved thermal dissipation properties for the light-emitting diode package 400 of the present invention.

The further embodiment depicted in FIGS. 4A–B also incorporates a substrate thermal via 466 positioned beneath the conductive plate 460 and die 470. In operation, the combination of the conductive plates 460, 462nd second plurality of castellated side holes 458, and the substrate thermal via 466 conduct thermal energy away from the die 470 containing the light-emitting diode to the light-emitting diode assembly base pad 452. The top pad 430 and first plurality of castellated side holes 418 in turn serve to conduct thermal energy away from the light-emitting diode assembly base pad 452 to the spacer assembly 410 base pad 412.

Figure 5A:
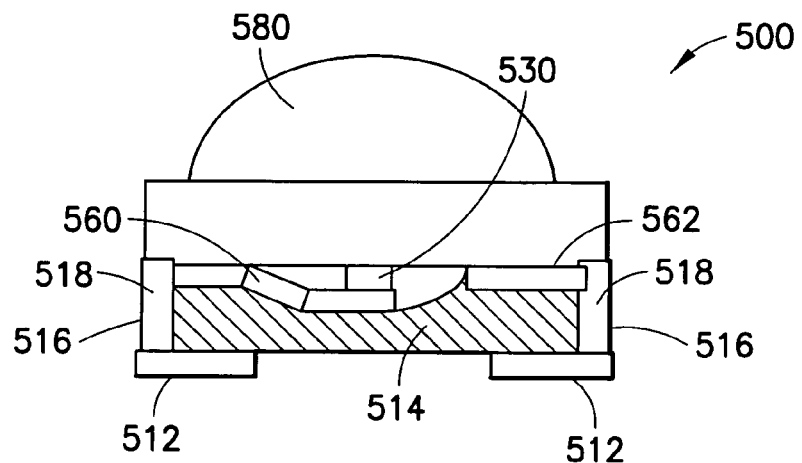
FIG. 5A is a cross-sectional view of an LED package made in accordance with the prior art taken along section E–E' of FIG. 5B.
Figure 5B:
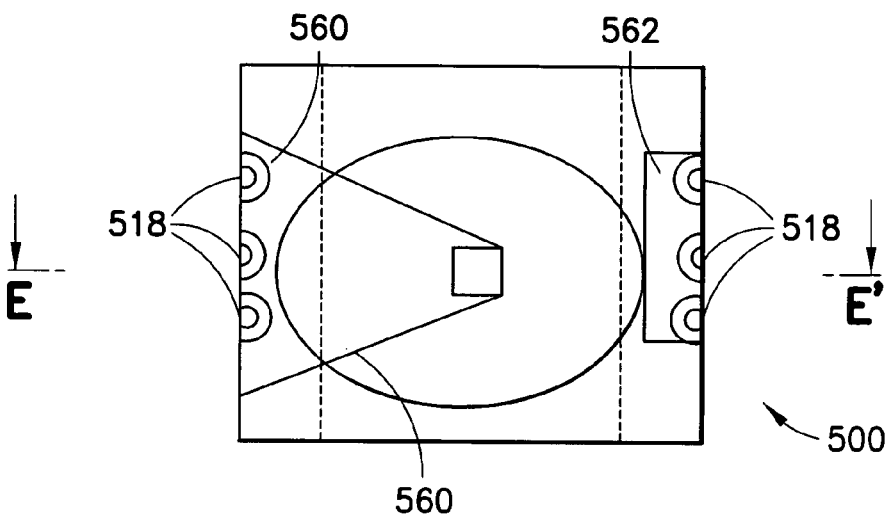
FIG. 5B is a top ghost view of an LED package made in accordance with the prior art.

As indicated previously, the improvements of the present invention can be incorporated in a light-emitting diode package not having a space assembly. FIGS. 5A–B depict a light-emitting diode package 500 made in accordance with the prior art. The light-emitting diode package 500 comprises a substrate 514 positioned above a base pad 512. Positioned on two sides 516 of the substrate is a plurality of castellated side holes 518 made in part from conductive material. Positioned above the substrate are two conductive plates 520, 522. Positioned above the conductive plate 520 and substrate 514 is a die 530 containing alight-emitting diode. A lens 580 is positioned above the die 530. As in the case of the light-emitting diode package 100 having a spacer assembly 110 made in accordance with the prior art depicted in FIGS. 1A–B, the light-emitting diode package 500 has limited thermal dissipation capabilities. In the first instance, the die is positioned above a substrate 514 that has limited thermal dissipation capabilities. Further, the limited surface area and small size of the conductive plates 520, 522 and plurality of castellated side holes further limits the thermal dissipation properties of the light-emitting diode package 500.

Figure 6A:
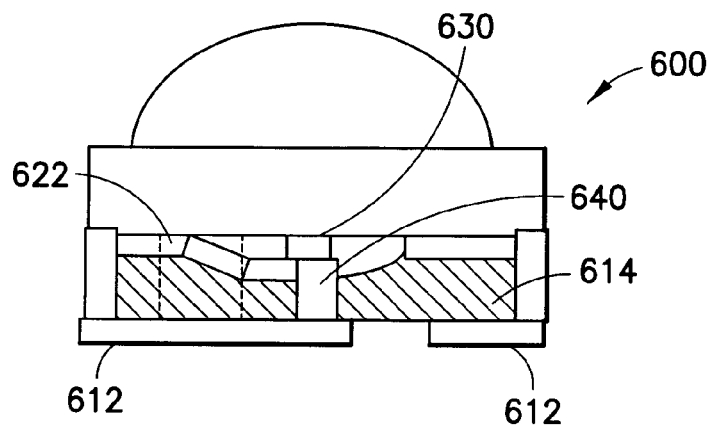
FIG. 6A is a cross-sectional view of an LED package made in accordance with yet another embodiment of the present invention taken along section F–F' of FIG. 6B.
Figure 6B:
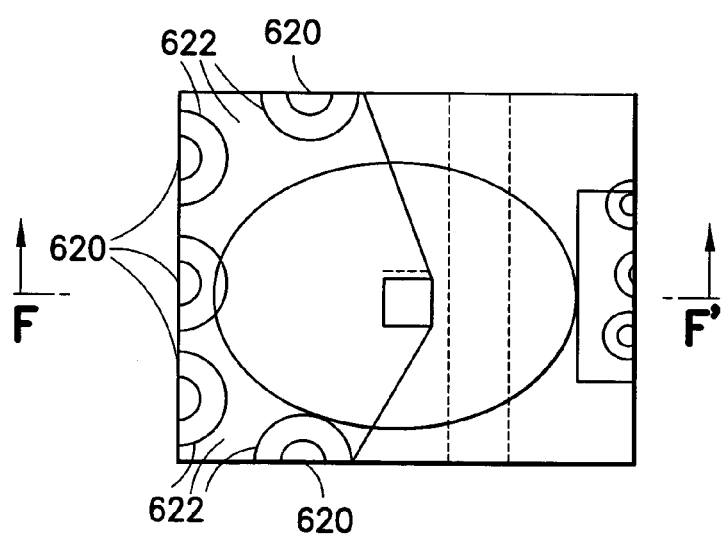
FIG. 6B is a top ghost view of an LED package made in accordance with yet another embodiment of the present invention.

A light-emitting diode package 600 made in accordance with the present invention which overcomes the limitations of the light-emitting diode package 500 of the prior art is depicted in FIGS. 6A–B. As is apparent, the light-emitting diode package 600 made in accordance with the present invention lacks a spacer assembly, illustrating that the teachings of the present invention can be applied to a light-emitting diode package not having a spacer assembly.

The light-emitting diode package 600 of the present invention depicted in FIGS. 6A–B comprises a substrate 614 positioned above a base pad 612. Located on at least three sides of the substrate 514 is a plurality of castellated side holes 620 cooperating with conductive plate 622 which fans outward from a die 630 containing a light-emitting diode. The conductive plate is of enlarged dimension and contacts ones of the plurality of castellated side holes on three sides of the spacer. In addition, there is a substrate thermal via 640 positioned beneath the die 630 containing the light-emitting diode.

Figure 7A:
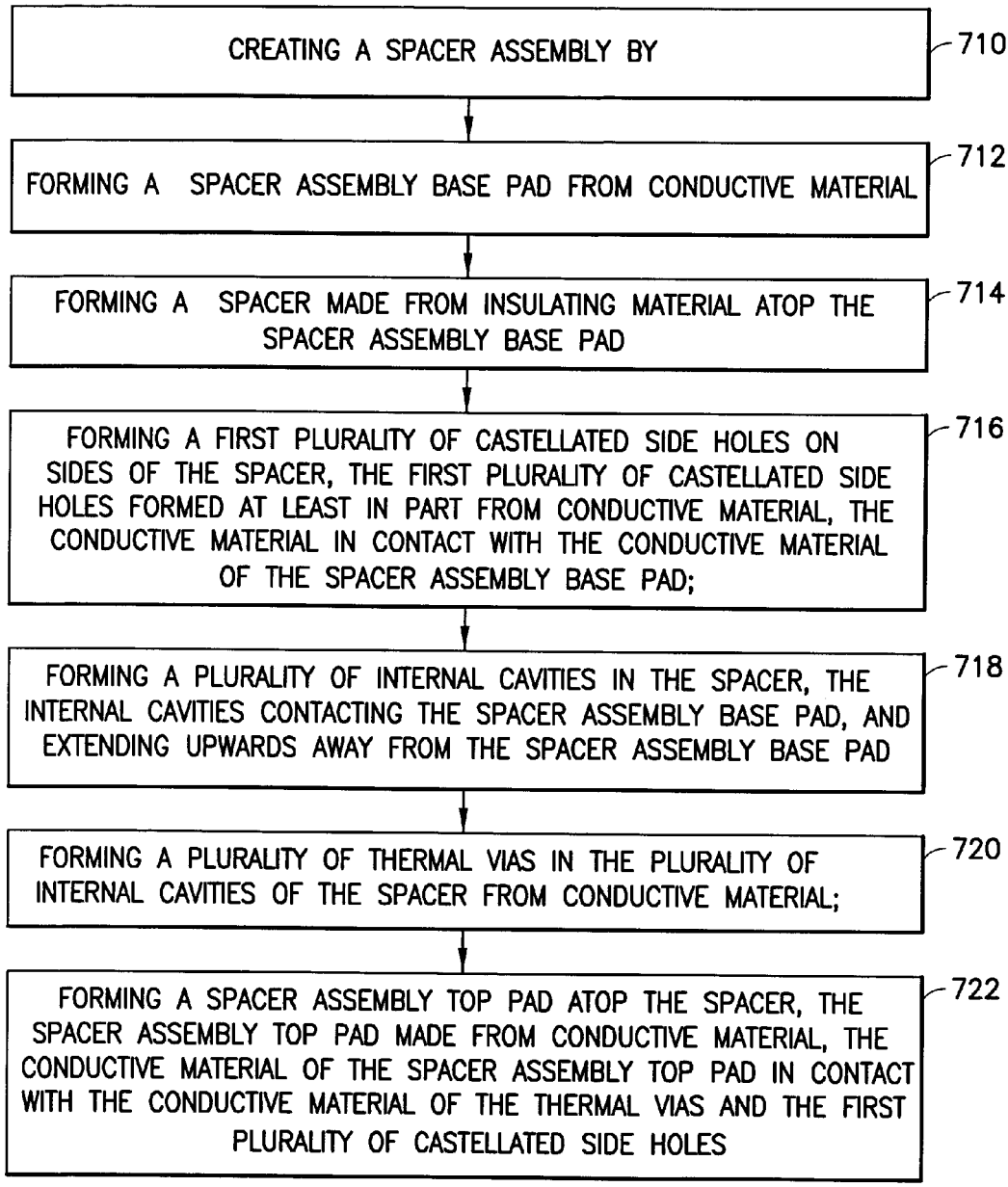
FIGS. 7A–7B is a block diagram depicting the steps of a method for making an high-power LED package in accordance with the present invention.
Figure 7B:
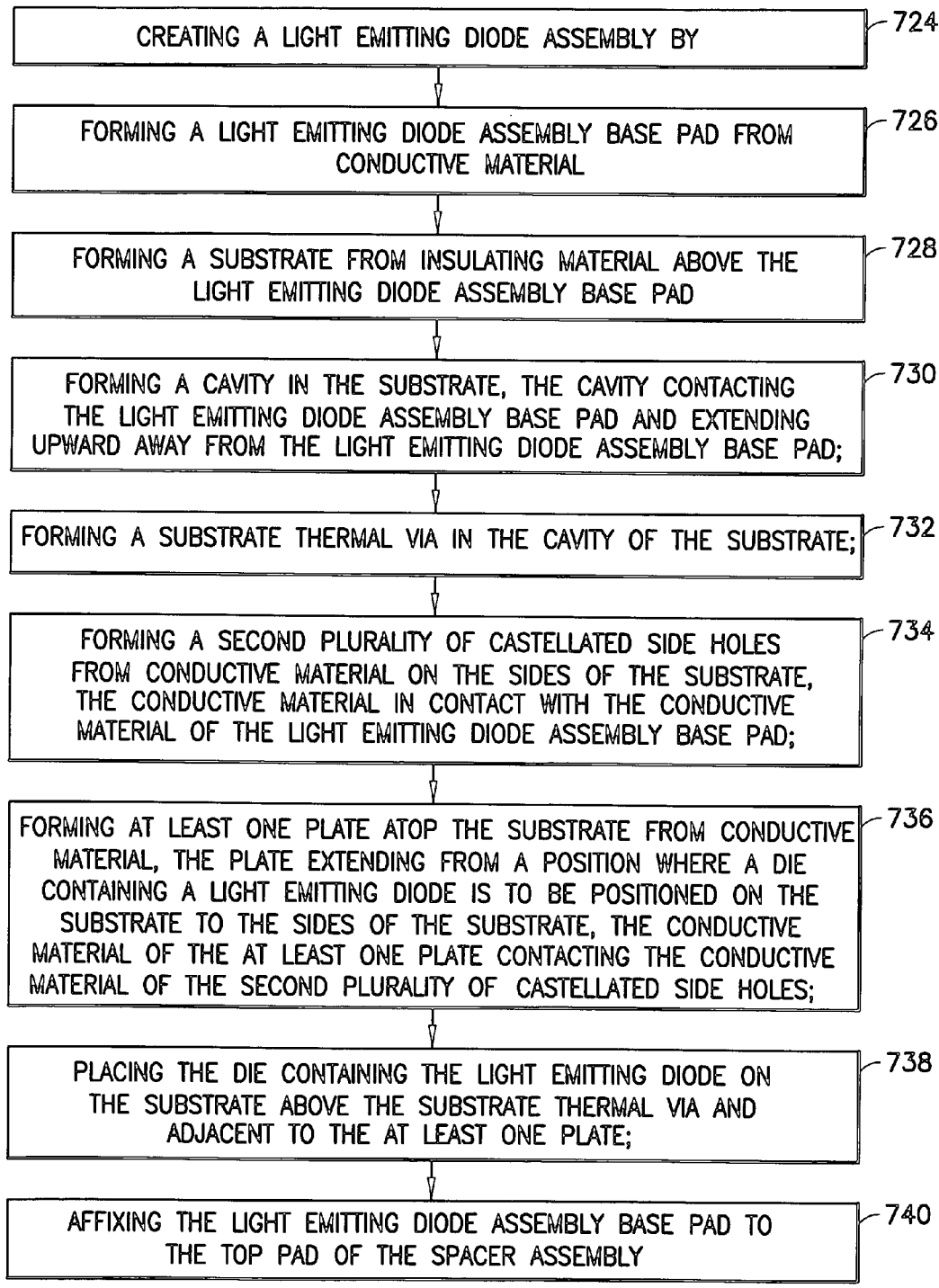

The present invention further comprises methods for constructing a light-emitting diode package having improved thermal dissipation properties. One such method is depicted in FIGS. 7A–B and comprises a step 710 of creating a spacer assembly by first forming a spacer assembly base pad from conductive material at step 712. Then, at step 714 a spacer made from insulating material is affixed to the spacer assembly base pad. Next, at step 716 a first plurality of castellated side holes is formed on sides of the spacer. The first plurality of castellated side holes may comprise, for example, semi-circular indentations extending vertically up and down sides of the spacer. The first plurality of castellated side holes are plated with conductive material which is in contact with the spacer assembly base pad. Then, at step 718, a plurality of internal cavities is formed in the spacer by drilling the spacer. The internal cavities contact the spacer assembly base pad on one end and extend upward away from the spacer assembly base pad. In alternate embodiments of the method, the spacer may be formed by a casting or molding process. In such processes, the first plurality of castellated side holes and internal cavities can be cast or molded into the spacer. Next, at step 720, thermal vias are formed in each of the internal cavities by, for example, plating the walls of the internal cavities with conductive material, or by filling the cavities with conductive material. Then, at step 722 a spacer assembly top pad is affixed to the top of the spacer. The spacer assembly top pad can be used as a solder pad to affix a light emitting diode assembly to the spacer assembly. The spacer assembly top pad is made from conductive material which is in contact with the conductive material of the thermal vias and the first plurality of castellated side holes.

The second part of the method is depicted in FIG. 7B and comprises at step 724 creating a light emitting diode assembly by first creating a light emitting diode assembly base pad from conductive material at step 726. Then, at step 728 a substrate comprising insulating material is formed atop the light-emitting diode assembly base pad. Next, at step 730 a cavity is formed in the substrate by, for example, drilling. The cavity contacts the light-emitting diode assembly and extends upward away from the light emitting diode assembly base pad. Then, at step 732 a substrate thermal via is formed in the cavity by plating the sides of the cavity with conductive material, or by filling the cavity with conductive material. Next, at step 734 a second plurality of castellated side holes are formed in sides of the substrate. The second plurality of castellated side holes comprise semi-circular indentations that extend vertically up and down the sides of the substrate, although other cross-sections can be adopted, for example, square or rectangular. The surfaces of the castellated side holes are plated with conductive material which is in contact with the conductive material of the light-emitting diode assembly base pad. Then, at step 736 at least one plate is formed above the substrate; the plate is made from conductive material and extends from a position where a die containing a light-emitting diode is to be positioned on the substrate to the sides of the substrate. The conductive material of the at least one plate contacts the conductive material of the second plurality of castellated side holes. Next, at step 738, the die containing the light-emitting diode is placed on the substrate above the substrate thermal via and adjacent to the at least one plate. Then at step 740, the light-emitting diode assembly base pad is affixed to the top pad of the spacer assembly.

One of ordinary skill in the art will understand that one or more additional steps may need to be performed to establish electrical contacts for the light emitting diode. In other embodiments, the conductive elements of the present invention may serve a dual purpose by both establishing electrical contacts with the light emitting diode and conducting thermal energy away from the light emitting diode.

In addition, one of ordinary skill in the art will understand that one or more steps of the method of the present invention may be deleted where it is desired that an improved light-emitting diode package be constructed that does not incorporate all of the improvements of the present invention. Such methods are still within the scope of the present invention. For example, in one alternate method, the steps having to do with creation of a spacer assembly may be deleted where a spacer assembly is not desired. In other alternate methods of the present invention, a spacer assembly may be created which lacks internal cavities for accommodating thermal vias. The light-emitting diode packages made with these alternate methods will, nonetheless, incorporate one or more improvements of the preset invention.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent high power infrared light-emitting diode packages may be attempted by those skilled in the art. However, all such and similar modifications of the teachings of this invention will still fall within the scope of this invention.

Thus it is seen that an high-power infrared light-emitting diode package and methods for making same are provided by the present invention. One skilled in the art will appreciate that the various embodiments described herein can be practiced individually; in combination with one or more other embodiments described herein; or in combination with IR LED package designs differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:

1. A light-emitting diode package comprising:
   a spacer assembly comprising:
      a base pad made from conductive material, wherein the base pad comprises first and second portions with a gap between the first and second portions;
      a spacer made from insulating material positioned, atop the base pad, where a first plurality of castellated side holes are formed in sides of the spacer, the first plurality of castellated side holes formed at least in part from conductive material, the conductive material of the first plurality of castellated side holes in contact with the conductive material of the first portion of the base pad, the spacer further comprising a plurality of internal cavities in contact with, and extending away from, the first portion of the base pad;
      a top pad made from conductive material positioned above the spacer, wherein the top pad comprises first and second portions with a gap between the first and second portions, the first portion of top pad in contact with the first plurality of castellated side holes of the spacer and the plurality of internal cavities of the spacer;
      a thermal via formed in each of the plurality of internal cavities in the spacer, the thermal vias made from conductive material and serving to conduct thermal energy from the first portion of the top pad to the first portion of the base pad;
   a light-emitting diode assembly positioned above the spacer assembly and affixed to the top pad of the spacer assembly, the light-emitting diode assembly comprising:
      a light-emitting diode assembly base pad made from conductive material, wherein the light-emitting diode assembly base pad comprises first and second portions with a gap between the first and second portions;
      a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the first portion of the light-emitting diode assembly base pad;
      a die containing a light-emitting diode positioned above the substrate;
      at least one plate made from conducting material positioned atop the substrate extending from the die to sides of the substrate, the at least one plate serving to conduct thermal energy away from the die containing the light-emitting diode to the second plurality of castellated side holes in the substrate; and
      a substrate thermal via positioned within a cavity of the substrate, the substrate thermal via extending from the die to the first portion of the light-emitting diode assembly base pad, the substrate thermal via made from conducting material and serving to conduct thermal energy from the die to the first portion of the light-emitting diode assembly base pad; and
   the first portions of the spacer assembly base pad, spacer assembly top pad and the light emitting diode assembly base pad extending to a position directly beneath the light-emitting diode;
   wherein during operation thermal energy is first conducted away from the light-emitting diode to the first portion of the light-emitting diode assembly base pad by the substrate thermal via and the combination of the at least one plate and the second plurality of castellated side holes, and then conducted from the first portion of the light-emitting diode assembly base pad to the first portion of the base pad of the spacer assembly by the first portion of the top pad, the first plurality of castellated side holes and the plurality of thermal vias positioned within the spacer.

2. The light-emitting diode package of claim 1 where the substrate has at least four sides, and where at least one castellated side hole from the second plurality of castellated side holes is positioned on each of three sides of the substrate.

3. The light-emitting diode package of claim 2 where the at least one plate fans outward from beneath the light-emitting diode and contacts castellated sides holes from the second plurality positioned on the three sides of the substrate.

4. The light-emitting diode package of claim 1 where the conductive material of the first and second plurality of castellated side holes is copper.

5. The light-emitting diode package of claim 1 where the conductive material of the plurality of thermal vias positioned within the spacer and the substrate thermal via is copper.

6. The light-emitting diode package of claim 1 where the light-emitting diode assembly further comprises a lens positioned atop the die containing the light-emitting diode.

7. A light-emitting diode package comprising:
a base pad made from conductive material, wherein the base pad comprises first and second portions with a gap between the first and second portions;
a substrate made from insulating material positioned atop the base pad, where a plurality of castellated side holes are formed in sides of the substrate, the plurality of castellated side holes formed at least in part from conductive material, the conductive material of the plurality of castellated side holes in contact with the conductive material of the first portion of the base pad;
a die containing a light-emitting diode positioned above the substrate;
at least one plate made from conducting material positioned atop the substrate and extending from the die to sides of the substrate, the at least one plate serving to conduct thermal energy away from the die containing the light-emitting diode to the castellated side holes of the substrate; and
a substrate thermal via positioned within a cavity of the substrate, the substrate thermal via extending from the die to the first portion of the base pad, the substrate thermal via made from conductive material and serving to conduct thermal energy from the die containing the light-emitting diode to the first portion of the base pad; and
wherein during operation thermal energy is conducted away from the die containing the light-emitting diode to the first portion of the base pad by the substrate thermal via and the combination of the at least one plate and the plurality of castellated side holes.

8. The light-emitting diode package of claim 7 where the substrate has at least four sides, and at least one castellated side hole from the plurality of castellated side holes is positioned on each side of three sides of the substrate.

9. The light-emitting diode package of claim 8 where the at least one plate fans outward from the die containing the light-emitting diode and contacts castellated sides holes from the plurality positioned on the three sides of the substrate.

10. The light-emitting diode package of claim 7 where the conductive material of the substrate thermal via is copper.

11. The light-emitting diode package of claim 7 where the conductive material of the plurality of castellated side holes is copper.

12. The light-emitting diode package of claim 7 where the light-emitting diode package further comprises a lens positioned atop the die containing the light-emitting diode.

13. A light-emitting diode package comprising:
a spacer assembly comprising:
a base pad made from conductive material, wherein the base pad comprises first and second portions with a gap between the first and second portions;
a spacer made from insulating material positioned atop the base pad, where a first plurality of castellated side holes are formed in sides of the spacer, the first plurality of castellated side holes formed at least in part from conductive material, the conductive material of the first plurality of castellated side holes in contact with the conductive material of the first portion of the base pad, the spacer further comprising a plurality of internal cavities in contact with, and extending away from, the base pad;
a top pad made from conductive material positioned above the spacer, wherein the top pad comprises first and second portions with a gap between the first and second portions, the first portion of the top pad in contact with the first plurality of castellated side holes of the spacer and the plurality of internal cavities of the spacer;
a thermal via formed in each of the plurality of internal cavities in the spacer, the thermal vias made from conductive material and serving to conduct thermal energy from the first portion of the top pad to the first portion of the base pad;
a light-emitting diode assembly positioned above the spacer assembly and affixed to the top pad of the spacer assembly, the light-emitting diode assembly comprising:
a light-emitting diode assembly base pad made from conductive material, wherein the light-emitting diode assembly base pad comprises first and second portions with a gap between the first and second portions;
a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the first portion of the light-emitting diode assembly base pad;
a die containing a light-emitting diode positioned above the substrate;
at least one plate made from conducting material positioned atop the substrate extending from the die to sides of the substrate, the at least one plate serving to conduct thermal energy away from the die containing the light-emitting diode to the second plurality of castellated side holes in the substrate; and
the first portion of the spacer assembly base pad, spacer assembly top pad, and the light-emitting diode base pad extending to a position directly beneath the light-emitting diode;
wherein during operation thermal energy is first conducted away from the light-emitting diode to the first portion of the light-emitting diode assembly base pad by the at least one plate and the second plurality of castellated side holes, and then conducted from the first portion of the light-emitting diode assembly base pad to the first portion of the base pad of the spacer assembly by the first portion of the top pad, the first plurality of castellated side holes and the plurality of thermal vias positioned within the spacer.

14. The light-emitting diode package of claim 13 where the substrate has at least four sides, and where at least one castellated side hole from the second plurality of castellated side holes is positioned on each of three sides of the base.

15. The light-emitting diode package of claim 14 where the at least one plate fans outward from the light-emitting diode and contacts castellated sides holes from the second plurality positioned on the three sides of the substrate.

16. The light-emitting diode package of claim 13 where the light-emitting diode assembly further comprises a lens positioned atop the die containing the light-emitting diode.

17. A light-emitting diode package comprising:
- a spacer assembly comprising:
  - a base pad made from conductive material, wherein the base pad comprises first and second portions with a gap between the first and second portions;
  - a spacer made from insulating material positioned atop the base pad, where a first plurality of castellated side holes are formed in sides of the spacer, the first plurality of castellated side holes formed at least in part from conductive material, the conductive material of the first plurality of castellated side holes in contact with the first portion of the conductive material of the base pad;
  - a top pad made from conductive material positioned above the spacer, wherein the top pad comprises first and second portions with a gap between the first and second portions, the first portion of the top pad in contact with the first plurality of castellated side holes of the spacer;
- a light-emitting diode assembly positioned above the spacer assembly and affixed to the top pad of the spacer assembly, the light-emitting diode assembly comprising:
  - a light-emitting diode assembly base pad made from conductive material, wherein the light-emitting diode assembly base pad comprises first and second portions with a gap between the first and second portions;
  - a substrate made from insulating material positioned atop the light-emitting diode assembly base pad, where a second plurality of castellated side holes are fabricated in sides of the substrate, the second plurality of castellated side holes formed at least in part from conductive material, the conductive material of the second plurality of castellated side holes in contact with the conductive material of the first portion of the light-emitting diode assembly base pad;
  - a die containing a light-emitting diode positioned atop the substrate;
  - at least one plate made from conducting material positioned atop the substrate extending from the die to sides of the substrate, the at least one plate serving to conduct thermal energy away from the die containing the light-emitting diode to the second plurality of castellated side holes in the substrate; and
  - a substrate thermal via positioned within a cavity of the substrate, the substrate thermal via extending from the die to the first portion of the light-emitting diode assembly base pad, the substrate thermal via made from conducting material and serving to conduct thermal energy from the die to the first portion of the light-emitting diode assembly base pad; and
- the first portions of the spacer assembly base pad, spacer assembly top pad and the light emitting diode assembly base pad extending to a position directly beneath the light-emitting diode;
- wherein during operation thermal energy is first conducted away from the light-emitting diode to the first portion of the light-emitting diode assembly base pad by the substrate thermal via and the combination of the at least one plate and the second plurality of castellated side holes, and then conducted from the first portion of the light-emitting diode assembly base pad to the first portion of the base pad of the spacer assembly by the first portion of the top pad and the first plurality of castellated side holes.

\* \* \* \* \*